(12) United States Patent
Fredeman et al.

(10) Patent No.: US 10,832,756 B1
(45) Date of Patent: Nov. 10, 2020

(54) NEGATIVE VOLTAGE GENERATION FOR COMPUTER MEMORY

(71) Applicant: International Business Machines Corporation, Armonk, NY (US)

(72) Inventors: Gregory J. Fredeman, Wappingers Falls, NY (US); Thomas E. Miller, Poughkeepsie, NY (US); Dinesh Kannambadi, Wappingers Falls, NY (US); Phil Paone, Rochester, MN (US); Donald W. Plass, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/587,501

(22) Filed: Sep. 30, 2019

(51) Int. Cl.
| G11C 5/14 | (2006.01) |
| G11C 11/4074 | (2006.01) |
| G11C 8/18 | (2006.01) |
| G11C 11/408 | (2006.01) |
| G11C 11/4076 | (2006.01) |

(52) U.S. Cl.
CPC .......... *G11C 11/4074* (2013.01); *G11C 5/145* (2013.01); *G11C 5/147* (2013.01); *G11C 8/18* (2013.01); *G11C 11/4076* (2013.01); *G11C 11/4085* (2013.01)

(58) Field of Classification Search
CPC . G11C 11/4085; G11C 11/4074; G11C 5/145; G11C 8/18
USPC ...................................................... 365/233.1
See application file for complete search history.

(56) References Cited

U.S. PATENT DOCUMENTS

| 5,365,200 A | 11/1994 | Honnigford et al. |
| 5,760,620 A | 6/1998 | Doluca |
| 6,535,025 B2 | 3/2003 | Terzioglu et al. |
| (Continued) | | |

FOREIGN PATENT DOCUMENTS

| CN | 1691204 A | 11/2005 |
| EP | 1815303 B1 | 1/2009 |
| EP | 3273320 A1 | 1/2018 |

OTHER PUBLICATIONS

Transmittal Form PTO/SB/21 signed Mar. 16, 2020.
(Continued)

*Primary Examiner* — Xiaochun L Chen
(74) *Attorney, Agent, or Firm* — Cantor Colburn LLP; William Kinnaman

(57) ABSTRACT

Techniques for negative voltage generation for a computer memory are described herein. An aspect includes enabling a first negative word line voltage (VWL) clock generator. Another aspect includes providing, by the first VWL clock generator, based on a clock signal, a first pump clock signal to a first VWL pump, and a second pump clock signal to a second VWL pump. Another aspect includes generating a VWL based on the first VWL pump and the second VWL pump, wherein the VWL is provided to a word line driver of a computer memory module. Another aspect includes comparing the VWL to a VWL reference voltage. Another aspect includes, based on the VWL being below the VWL reference voltage, disabling the first VWL clock generator, wherein the first VWL pump and the second VWL pump are disabled based on disabling the first VWL clock generator.

20 Claims, 5 Drawing Sheets

(56) References Cited

U.S. PATENT DOCUMENTS

| | | | |
|---|---|---|---|
| 7,982,500 B2 | 7/2011 | Luich | |
| 8,599,639 B2 * | 12/2013 | Akiyama | G05F 1/468 365/226 |
| 2003/0151072 A1 | 8/2003 | Leung et al. | |
| 2006/0202741 A1 | 9/2006 | Tran et al. | |
| 2012/0206988 A1 | 8/2012 | Song et al. | |
| 2013/0249624 A1 | 9/2013 | Akiyama et al. | |

OTHER PUBLICATIONS

Fredeman et al., "Voltage BITLINE High (VBLH) Regulation for Computer Memory," U.S. Appl. No. 16/587,496, filed Sep. 30, 2019.

IBM "List of IBM Patents or Patent Applications Treated as Related; (Appendix P)", Filed Sep. 30, 2019, 2 pages.

Fredeman et al., "Bit-Line MUX Driver With Diode Header for Computer Memory" U.S. Appl. No. 16/587,560, filed Sep. 30, 2019.

* cited by examiner

NEGATIVE VOLTAGE GENERATION FOR COMPUTER MEMORY

BACKGROUND

The present invention generally relates to computer memory, and more specifically, to negative voltage generation for a computer memory.

Computer memory modules including embedded dynamic random access memory (eDRAM) are widely used for their improved performances in high-speed computing applications. An eDRAM module may include a plurality of cells arranged in an array, each cell being addressed by a word line (WL) and a bit line (BL). Each cell may contain a transistor that may include a high threshold voltage (e.g., thick oxide) n-type metal oxide semiconductor (NMOS) device and a deep trench capacitor. The NMOS gate may be connected to the signal WL which is driven to high voltage (VPP), which may be approximately 1.55 volts (V), when writing to or reading from the cell, and a negative word line voltage (VWL), which may be approximately −0.4V, when a cell is in standby.

SUMMARY

Embodiments of the present invention are directed to negative voltage generation for a computer memory. A non-limiting example method includes enabling a first negative word line voltage (VWL) clock generator. The method also includes providing, by the first VWL clock generator, based on a clock signal, a first pump clock signal to a first VWL pump, and a second pump clock signal to a second VWL pump, wherein the first pump clock signal is out of phase with the second pump clock signal. The method also includes generating a VWL based on the first VWL pump and the second VWL pump, wherein the VWL is provided to a word line driver of a computer memory module. The method also includes comparing the VWL to a VWL reference voltage. The method also includes, based on the VWL being below the VWL reference voltage, disabling the first VWL clock generator, wherein the first VWL pump and the second VWL pump are disabled based on disabling the first VWL clock generator.

Other embodiments of the present invention implement features of the above-described method in systems and devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

One or more embodiments of the present invention provide a negative voltage generation system for a computer memory. An integrated circuit, such as a processor chip including embedded memory such as eDRAM, may need to generate a negative word line voltage (VWL). For example, word lines in an embedded dynamic random access memory (eDRAM) module may be driven to VWL during cell standby. During cell standby, if the WL is not driven to a negative voltage, the cell data may leak away due to subthreshold leakage.

A negative voltage generator for an eDRAM memory module may be implemented using thin oxide devices using a reference voltage (VREF_VWL) and a system-generated clock that creates a negative word line voltage for use in the eDRAM array. The negative voltage generator generates the negative voltage using standard logic devices, such as p-type field effect transistors (PFETs) and n-type field effect transistors (NFETs). A relatively small capacity pump may use a thin oxide device for the charging capacitor, comprising a transistor and wire. The pump may run based on either a system clock or an internal oscillator. A local clock buffer (LCB) and latch may be used to create a signal including 2 phases (high/low) that toggle every clock cycle. A plurality of charge pumps may generate 4 phase signals that lower VWL. Using multiple relatively small charge pumps may allow for improved integration of the pump into the system, and also improves the pump current capacity. The use of thin oxide devices throughout the charge pump is challenged if a supply voltage VDD (which may be about 1.15 volts) is used throughout the charge pumps, because VMAX may be violated. Therefore, an intermediate voltage bit line high (VBLH), which may be from about 0.7V to about 0.9V, may be used in the charge pumps to keep transistors out of VMAX violation in some embodiments. A level shifter may also be included to avoid VMAX violation and prevent device damage. In some embodiments of a system including a negative voltage generator, a narrow channel may be used, the positive pump may be moved to an external supply, and the negative pump may be brought into the eDRAM macro boundary in order to reduce the total area of the eDRAM.

Figure 1:
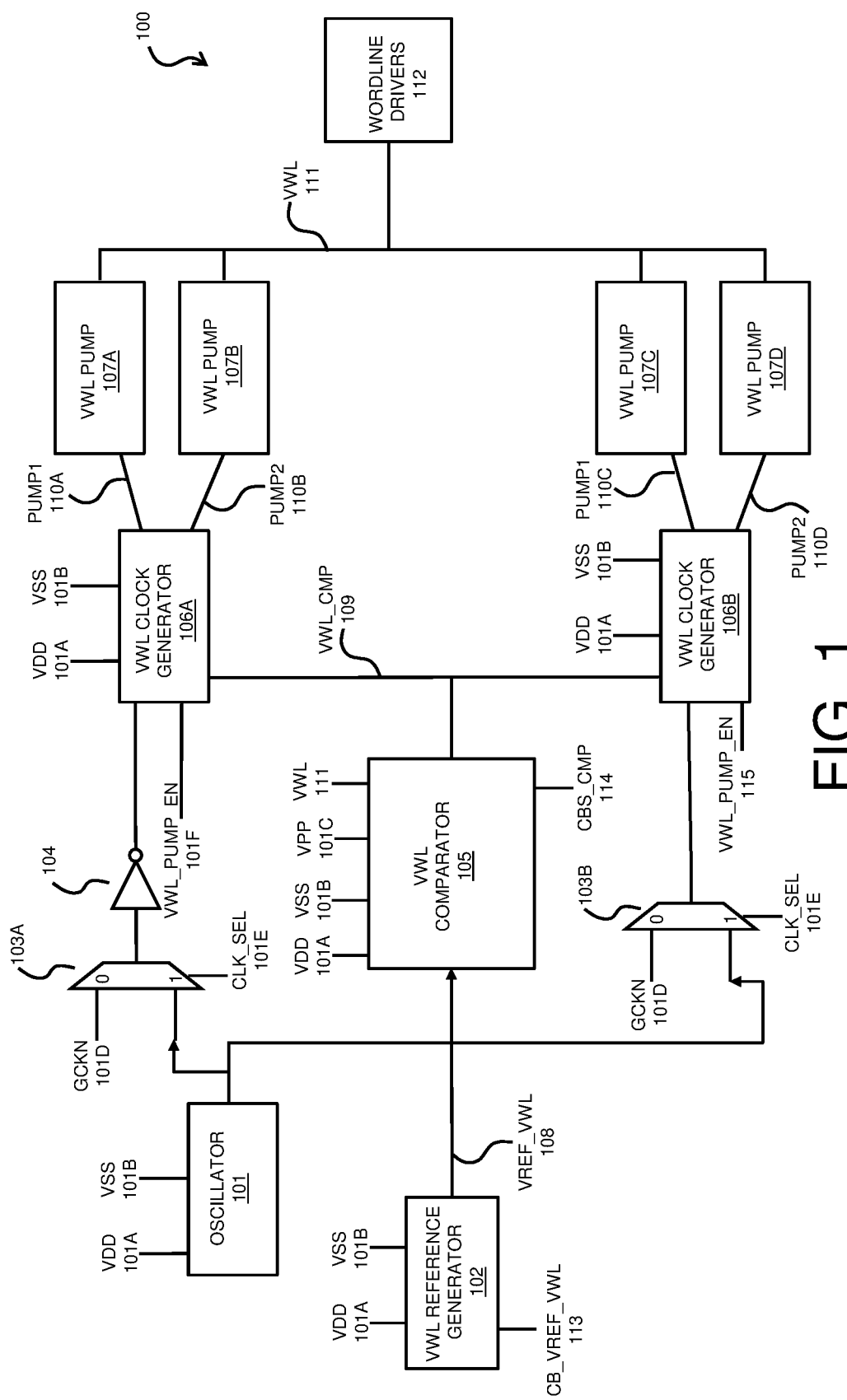
FIG. 1 is a block diagram of components of a negative voltage generation system for a computer memory in accordance with one or more embodiments of the present invention.

FIG. 1 is a block diagram a negative voltage generation system 100 for a computer memory in accordance with one or more embodiments of the present invention. Embodiments of system 100 may be embedded in a processor chip that includes eDRAM computer memory, and may provide VWL 111, which may be a negative voltage (e.g., about −0.4V) to word line drivers, such as word line drivers 112, of the eDRAM cell array. The system 100 is connected to supply voltage VDD 101A, ground VSS 101B, and a high voltage VPP 101C. The system 100 includes an oscillator 101 that outputs a signal to multiplexers 103A-B. Each of multiplexers 103A-B also receives a clock signal GCKN 101D, and is controlled by a direct current (DC) clock selection control signal CLK_SEL 101E. Each of multiplexers 103A-B may output the signal from oscillator 101 at startup based on CLK_SEL 101E, and then be switched over to output GCKN 101D after a startup period has elapsed. Inverter 104 is located at an output of multiplexer 103A, such that the clock signal output to VWL clock generator 106A by multiplexer 103A is opposite in phase to the clock signal output to VWL clock generator 106B by multiplexer 103B.

System 100 further includes a VWL reference generator 102 and VWL comparator 105. The VWL reference generator 102 generates a reference voltage VREF_VWL 108, and provides VREF_VWL 108 to VWL comparator 105. VWL comparator 105 compares VWL 111 to VREF_VWL 108, and, based the comparison, outputs a VWL comparator enable signal VWL_CMP 109 to each of VWL clock generators 106A-B. VWL_CMP 109 may be an alternating current (AC) signal that goes low when VWL 111 is above VREF_VWL 108, and goes high when VWL 111 is below VREF_VWL 108, in some embodiments. VWL clock generators 106A-B also receive a DC enable signal VWL_PUMP_EN 101F, which is a signal that may be independently used to enable or disable the VWL clock generators 106A-B. During regular operation of system 100, VWL_PUMP_EN 101F may be high. Based on both VWL_CMP 109 and VWL_PUMP_EN 101F being high, VWL clock generator 106A provides a first pump clock signal PUMP1 110A to VWL pump 107A and a second pump clock signal PUMP2 110B to VWL pump 107B, and VWL clock generator 106B provides a first pump clock signal PUMP1 110C to VWL pump 107C and a second pump clock signal PUMP2 110D to VWL pump 107D. Based on receiving the respective pump clock signals PUMP1 110A and 110C, and PUMP2 110B and 110D, VWL pumps 107A-D generate 4 phase signals that lower VWL 111, which is a negative voltage that is provided to word line drivers 112. VWL 111 is also provided from the outputs of the VWL pumps 107A-D to the VWL comparator 105.

VWL reference generator 102 receives a VWL reference voltage control bit CB_VREF_VWL 113, and VWL comparator 105 receives a plurality of comparator control bits CBS_CMP 114. The control bits CB_VREF_VWL 113 and CBS_CMP 114 may be DC signals that are provided to the system 100. In some embodiments, the control bits CB_VREF_VWL 113 and CBS_CMP 114 may be configured during initial set up of the system 100 based on the projected operating conditions, such as process, voltage, and temperature (PVT) conditions, of the memory module that includes the system 100, and may not be changed during operation of the memory module including the system 100. VWL clock generators 106A-B are discussed below in further detail with respect to FIG. 2. VWL comparator 105 is discussed below in further detail with respect to FIG. 3. VWL pumps 107A-D are discussed below in further detail with respect to FIG. 4.

It is to be understood that the block diagram of FIG. 1 is not intended to indicate that the system 100 is to include all of the components shown in FIG. 1. Rather, the system 100 can include any appropriate fewer or additional components not illustrated in FIG. 1 (e.g., additional memory components, embedded controllers, functional blocks, connections between functional blocks, modules, inputs, outputs, etc.). Further, the embodiments described herein with respect to system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
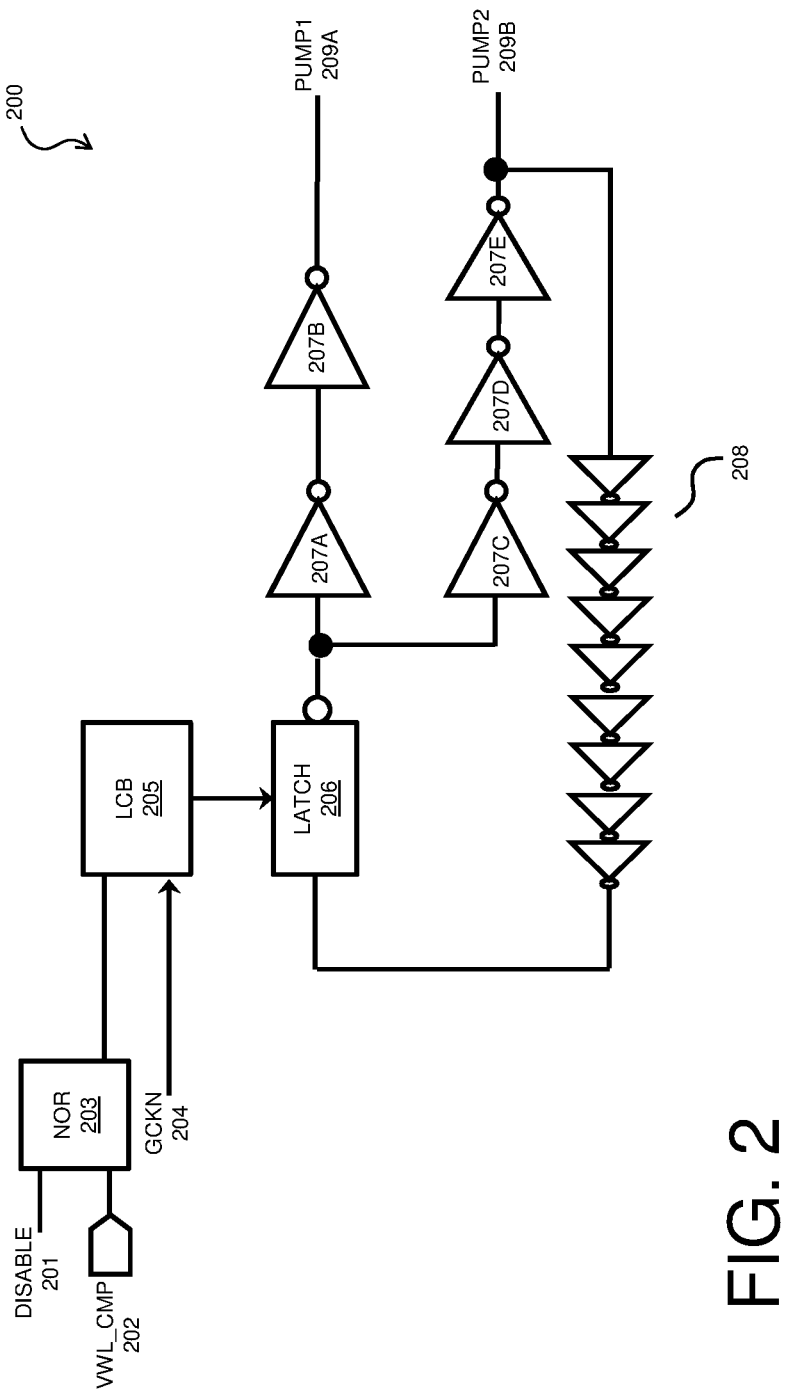
FIG. 2 is a block diagram of components of a negative word line voltage (VWL) clock generator circuit for a negative voltage generation system for a computer memory in accordance with one or more embodiments of the present invention.

FIG. 2 is a block diagram of a VWL clock generator circuit 200 for a negative voltage generation system for a computer memory in accordance with one or more embodiments of the present invention. Embodiments of a VWL clock generator circuit 200 may be included in each of VWL clock generators 106A-B of FIG. 1. Circuit 200 includes a NOR gate 203 that receives a disable signal 201, which may correspond to VWL_PUMP_EN 101F of FIG. 1, and a signal VWL_CMP 202, which may correspond to VWL_CMP 109 of FIG. 1. Disable signal 201 may be used to enable or disable the VWL clock generator circuit 200. During regular operation of circuit 200, disable signal 201 may be low in order to enable the circuit 200. VWL_CMP 202 may be an AC signal that goes low when VWL is above VREF_VWL, and goes high when VWL is below VREF_VWL, in some embodiments. Based on one or both of disable signal 201 and VWL_CMP 202 being high, there may be no signal output at PUMP1 209A and PUMP2 209B. Based on both disable signal 201 and VWL_CMP 202 being low, the output of NOR gate 203 enables LCB 205 to provide clock signal GCKN 204 to latch 206. GCKN 204 may correspond to GCKN 101D of FIG. 1. GCKN 204 is clock divided by the latch 206. The output of the latch 206 feeds inverters 207A-B to provide a first pump clock signal PUMP1 209A to a first VWL pump (e.g., PUMP1 110A to VWL pump 107A, or PUMP1 110C to VWL pump 107C in FIG. 1), and by inverters 207C-E to provide a second pump clock signal PUMP2 209B to a second VWL pump (e.g., PUMP2 110B to VWL pump 107B or PUMP2 110D to VWL pump 107D in FIG. 1). PUMP1 209A may be out of phase with PUMP2 209B. PUMP1 209A and PUMP2 209B may each be two-phase signals (e.g., high/low) that each toggle every clock cycle of GCKN 204 when the circuit 200 is enabled (e.g., both disable signal 201 and VWL_CMP 202 are high). PUMP2 209B is provided back to latch 206 via inverters 208; inverters 208 may include an odd number of inverters.

It is to be understood that the block diagram of FIG. 2 is not intended to indicate that the circuit 200 is to include all of the components shown in FIG. 2. Rather, the circuit 200 can include any appropriate fewer or additional components not illustrated in FIG. 2 (e.g., additional memory components, embedded controllers, functional blocks, connections between functional blocks, modules, inputs, outputs, etc.). Further, the embodiments described herein with respect to circuit 200 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 3:
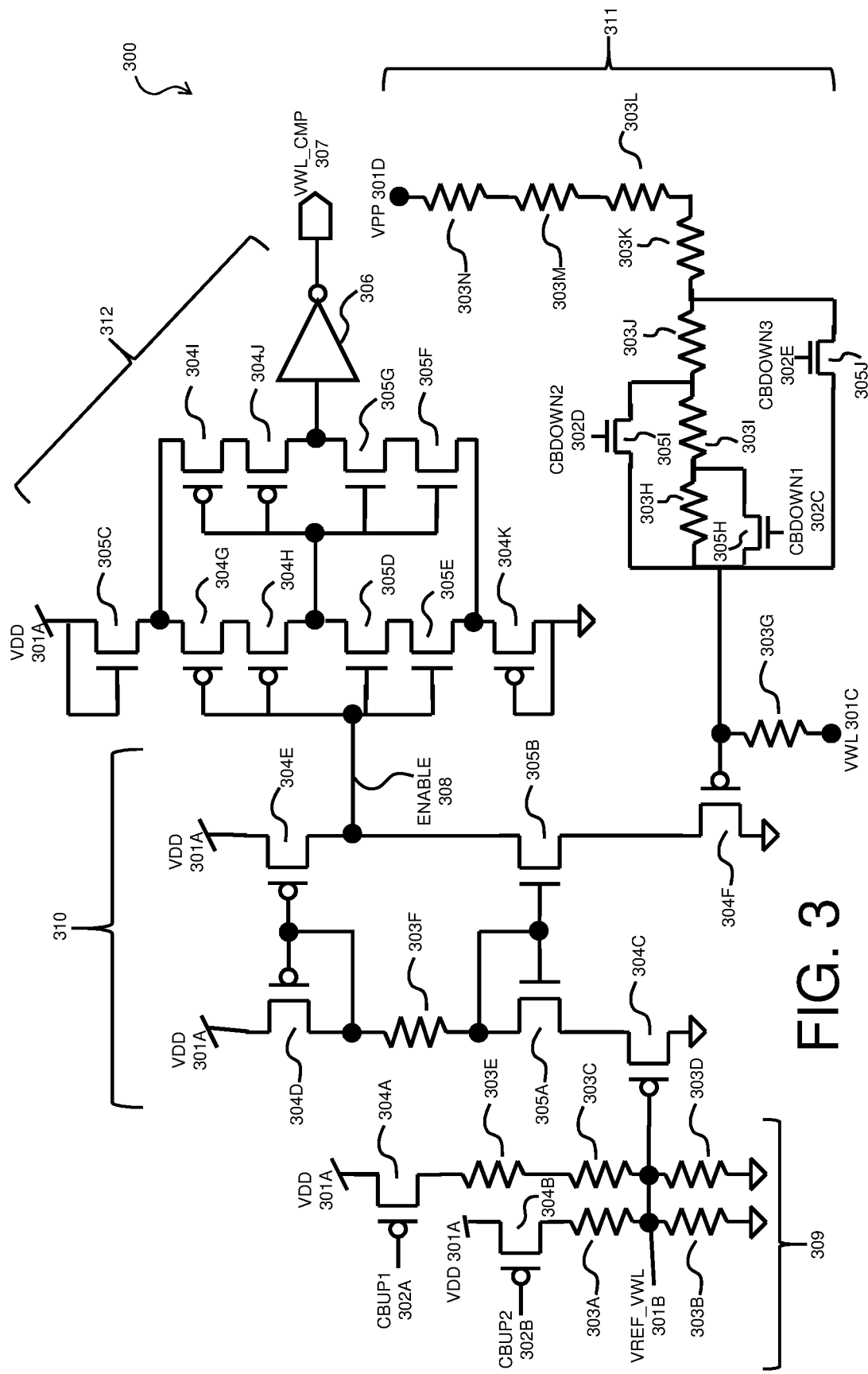
FIG. 3 is a block diagram of components of a VWL comparator circuit for a negative voltage generation system for a computer memory in accordance with one or more embodiments of the present invention.

FIG. 3 is a block diagram of components of a VWL comparator circuit 300 for a negative voltage generation system for a computer memory in accordance with one or more embodiments of the present invention. VWL comparator circuit 300 may be included in embodiments of VWL comparator 105 of FIG. 1. Operation of circuit 300 may be configured by a plurality of control bits 302A-E, which may correspond to comparator control bits CBS_CMP 114 of FIG. 1. The control bits 302A-E may be DC signals that are provided to the circuit 300. In some embodiments, the control bits 302A-E may be configured during initial set up of the circuit 300 based on the projected operating conditions, such as PVT conditions of the memory module that contains the circuit 300, and may not be changed during operation of the memory module including the circuit 300.

Circuit 300 includes a comparator 310. Circuit 300 receives VREF_VWL 301B, which may correspond to VREF_VWL 108 of FIG. 1, and VWL 301C, which may correspond to VWL 111 of FIG. 1. VREF_VWL 301B is compared to VWL 301C by comparator 310 in the circuit 300 to determine VWL_CMP 307, which may correspond to VWL_CMP 109 of FIG. 1. VWL_CMP 307 may be an AC signal that goes low when VWL 301C is above VREF_VWL 301B, and goes high when VWL 301C is below VREF_VWL 301B, in some embodiments.

VREF_VWL 301B is received by circuit 300 via input circuitry 309, including resistors 303A-E and PFETs 304A-B that are connected between VDD 301A and ground. Input circuitry 309 may be configured by control bits 302A-B to raise VREF_VWL 301B before VREF_VWL 301B is provided to the gate of PFET 304C in comparator 310. PFET 304A may be controlled by control bit CBUP1 302A to bypass resistors 303A-B, and PFET 304B may be controlled by control bit CBUP2 302B to bypass resistors 303C-E; control bits 302A-B may be configured during initial set up of the circuit 300 based on the projected operating conditions, such as PVT conditions, of the memory module that contains the circuit 300. In some embodiments, PFET 304A may be an 8 fin FET, and PFET 304B may be a 12 fin FET. In some embodiments, resistor 303A may be a 75K ohm resistor; resistor 303B may be a 1.2K ohm resistor; resistor 303C may be a 7.5K ohm resistor; resistor 303D may be a 1.2K ohm resistor; and resistor 303E may be a 7.5K ohm resistor.

VWL 301C is received by circuit 300 via resistor 303G at an output of resistor ladder 311. VWL 301C is provided to the gate of PFET 304F in comparator 310. Resistor ladder 311 includes resistors 303G-N connected between VWL 301C and VPP 301D. Resistor ladder 311 may be configured to lower VWL 301C before VWL 301C is provided to the comparator 310 via control bits 302C-E. Resistors 303H-J may be bypassed in resistor ladder 311 based on the control bits CBDOWN1 302C, CBDOWN2 302D, and CBDOWN3 302E that control respective NFETs 305H-J. Control bits 302C-E may be configured during initial set up of the circuit 300 based on the projected operating conditions, such as PVT conditions, of the memory module that contains the circuit 300. In some embodiments, resistors 303G-K may each be a 6.7K ohm resistor; resistors 303H-K may each be a 2.24K ohm resistor; and resistors 303L-N may each be a 6.7K ohm resistor.

VREF_VWL 301B is provided from input circuitry 309 to the gate of PFET 304C in comparator 310, and VWL 301C is provided from resistor ladder 311 to the gate of PFET 304F in comparator 310. Comparator 310 includes NFETs 305A-B, resistor 303F, and PFETs 304C-F connected between VDD 301A and ground. In some embodiments, when VWL 301C is below VREF_VWL 301B, the enable signal 308 that is output by comparator 310 may go high, and when VWL 301C is above VREF_VWL 301B, the enable signal 308 that is output by comparator 310 may go low. In some embodiments, PFET 304C may be a 24 fin FET; PFET 304D may be a 24 fin FET; PFET 304E may be a 24 fin FET; and PFET 304F may be a 24 fin FET. In some embodiments, NFET 305A may be a 24 fin FET, and NFET 305B may be a 24 fin FET. In some embodiments, resistor 303F may be a 5K ohm resistor.

Comparator 310 provides enable signal 308 to output circuitry comprising a stack inverter 312 that includes PFETs 304G-K, NFETs 305 C-G, and inverter 306. The stack inverter 312 may filter and invert enable signal 308 based on PVT conditions in the memory module that includes circuit 300 to produce VWL_CMP 307, which may be an AC signal. In some embodiments, when VWL 301C is below VREF_VWL 301B, VWL_CMP 307 may go high, and when VWL 301C is above VREF_VWL 301B, VWL_CMP 307 may go low. In some embodiments, PFETs 304 G-J may each be a 6 fin PFET, and PFET 304K may be a 24 fin PFET. In some embodiments, NFETs 305D-E may each be a 4 fin NFET, and NFETs 305 G-F may each be an 8 fin NFET.

It is to be understood that the block diagram of FIG. 3 is not intended to indicate that the circuit 300 is to include all of the components shown in FIG. 3. Rather, the circuit 300 can include any appropriate fewer or additional components not illustrated in FIG. 3 (e.g., additional memory components, embedded controllers, functional blocks, connections between functional blocks, modules, inputs, outputs, etc.). Further, the embodiments described herein with respect to circuit 300 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 4:
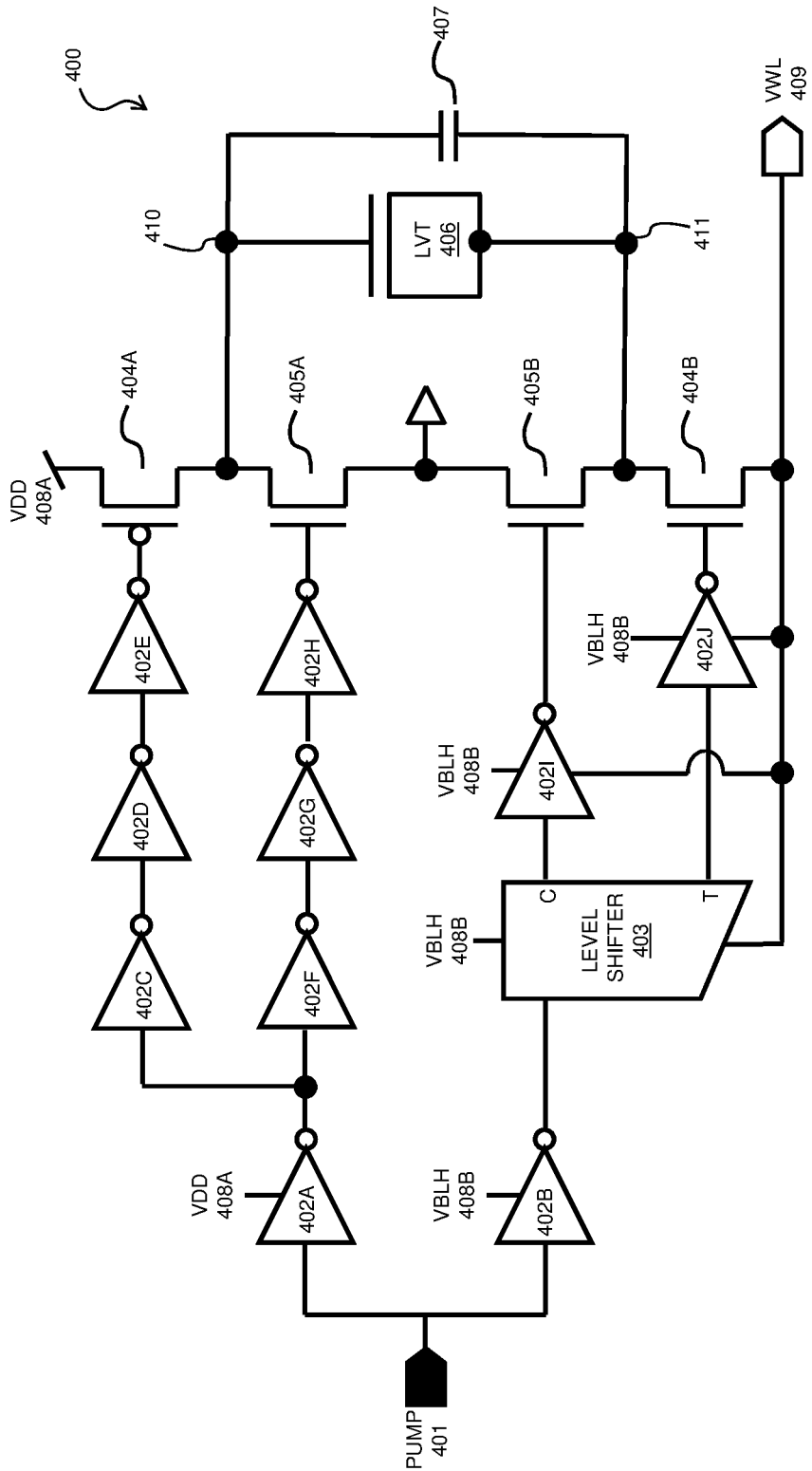
FIG. 4 is a block diagram of components of a VWL pump circuit for a negative voltage generation system for a computer memory in accordance with one or more embodiments of the present invention.

FIG. 4 is a block diagram of components of a VWL charge pump circuit 400 for a negative voltage generation system for a computer memory in accordance with one or more embodiments of the present invention. Embodiments of VWL charge pump circuit 400 may be included in each of VWL pumps 107 A-D of FIG. 1. Circuit 400 receives pump signal PUMP 401 from a VWL clock generator such as VWL clock generators 106A-B of FIG. 1. PUMP 401 may correspond to any of PUMP1 110A, PUMP2 110B, PUMP1 110C, and PUMP2 110D of FIG. 1. When PUMP 401 is disabled, or stops switching by circuit 400, VWL is not pumped down. When PUMP 401 is enabled, or starts switching, by circuit 400, VWL is pumped down. PUMP 401 may be a two-phase signal (e.g., high/low) that toggles every other clock cycle. PUMP 401 is propagated through inverters 402A-J to PFETs 404A-B and NFETs 405A-B to control the top plate of the charging capacitor composed of LVT 406 and capacitor 407. Capacitor 407 is connected in parallel with low threshold voltage device LVT 406. LVT 406 may be an n-type metal oxide semiconductor (NMOS) device in some embodiments. Capacitor 407 may be a wire capacitor in some embodiments. LVT 406 and capacitor 407 couple down node 411 when node 410 switches low. Circuit 400 outputs VWL 409 (which may correspond to VWL 111 of FIG. 1) via the coupling across capacitor 407 and LVT 406, in conjunction with any other VWL charge pumps in the system. The charging capacitor 407 and LVT 406 are configured such that the top node 410 and bottom node 411 are alternated based on the toggling of PUMP 401, e.g., top node 410 is pulled to VDD 408A while bottom node 411 is pulled to ground, and top node 410 is pulled to ground while bottom node 411 is connected to VWL 409. Inverters 402A is connected to VDD 408A, and inverters 402B, 402I, and 402J are connected to VBLH 408B. Level shifter 403 is also connected to VBLH 408B. VBLH 408B may be an intermediate voltage (e.g., from about 0.7V to about 0.9V) that is used to avoid VMAX conditions and prevent device damage in the devices of circuit 400, as a difference between VDD 408A and VWL 409 may be greater than VMAX, but a difference between VBLH 408B and VWL 409 may not be greater than VMAX.

A plurality of charge pumps such as circuit 400 (e.g., VWL pumps 107 A-D of FIG. 1) in a negative voltage generation system may generate 4 phase signals that lower VWL 409. VWL 409 may go down to about −0.4 volts in some embodiments. Use of LVT 406 and capacitor 407 in the VWL charge pump circuit 400 may avoid using a deep trench capacitor for the charging capacitor, and hence shrink the overall size of the VWL charge pump circuit 400. The use of the LVT 406 and capacitor 407 may reduce the amount of current capacity the charge pump may deliver. This loss in capacity may be compensated by including multiple instances of the VWL charge pump circuit 400 into the eDRAM macro boundary and connecting the multiple charge pumps together. This may reduce overall area required by the VWL charge pump circuit 400.

It is to be understood that the block diagram of FIG. 4 is not intended to indicate that the circuit 400 is to include all of the components shown in FIG. 4. Rather, the circuit 400 can include any appropriate fewer or additional components not illustrated in FIG. 4 (e.g., additional memory components, embedded controllers, functional blocks, connections between functional blocks, modules, inputs, outputs, etc.). Further, the embodiments described herein with respect to circuit 400 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 5:
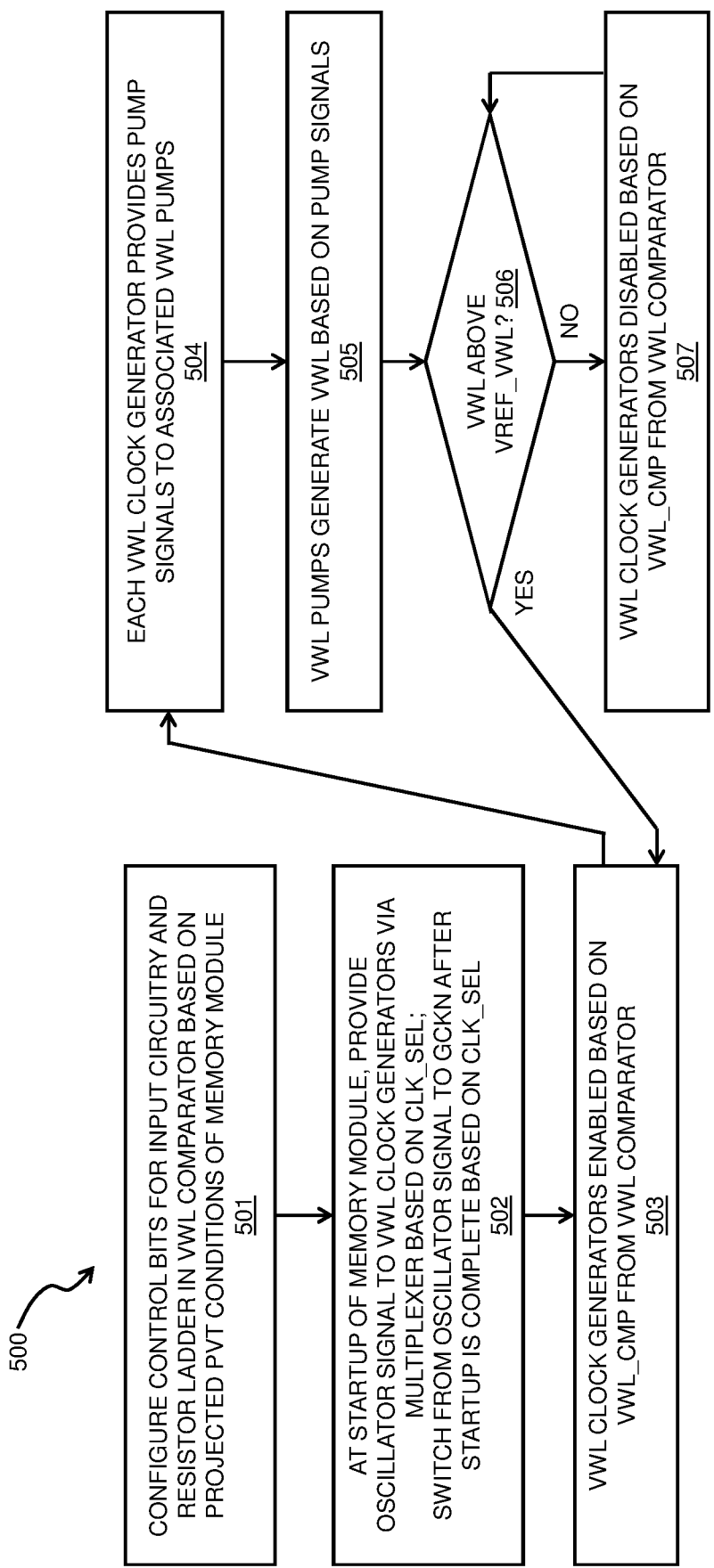
FIG. 5 is a flow diagram of a process for negative voltage generation for a computer memory in accordance with one or more embodiments of the present invention.

FIG. 5 shows a process flow diagram of a method 500 for negative voltage generation for a computer memory in accordance with one or more embodiments of the present invention. Method 500 may be implemented in a negative voltage generation system such as negative voltage generation system 100 of FIG. 1. In block 501, a plurality of control bits, including CB_VREF_VWL 113 and control bits CBS_CMP 114 as shown in FIG. 1, comprising DC signals may be configured to generate VWL 111 at a desired level (e.g., about −0.4V) based on projected PVT conditions of the memory module that includes the negative voltage generation system 100. CB_VREF_VWL 113 may determine a level of VREF_VWL 108 that is output from VWL reference generator 102 to VWL comparator 105. The control bits CBS_CMP 114 that are configured in block 501 may include control bits 302A-B corresponding to input circuitry 309, and control bits 302C-E, corresponding to resistor ladder 311, of VWL comparator circuit 300 of FIG. 3. The control bits that are configured in block 501 may stay constant during operation of the negative voltage generation system 100 after the configuration of block 501 is completed.

In block 502, a clock signal is provided to VWL clock generators 106A-B in negative voltage generation system 100. At startup of the memory module, which may be an eDRAM module, that includes the negative voltage generation system 100, a signal from an oscillator 101 may be provided as the clock signal to each of VWL clock generators 106A-B via multiplexers 103A-B based on CLK_SEL 101E. After a startup time period has elapsed, CLK_SEL 101E may toggle such that GCKN 101D is provided as the clock signal to each of the VWL clock generators 106A-B via multiplexers 103A-B. In block 503, the VWL clock generators 106A-B are enabled based on VWL_CMP 109 from the VWL comparator 105. In block 504, the VWL clock generators 106A-B provide respective pump signals PUMP1 110A/110C and PUMP2 110B/110D to VWL pumps 107A-D. The pump signals may be generated in block 503 as described above with respect to VWL clock generator circuit 200 of FIG. 2. In block 505, the VWL pumps 107A-B generate VWL 111 based on pump signals PUMP1 110A/110C and PUMP2 110B/110D. VWL 111 may be a negative voltage (e.g., about −0.4V) that is provided to word line drivers in the memory module for use during cell standby. VWL 111 may be generated in block 505 by each VWL pump 107A-D as described with respect to VWL pump circuit of FIG. 4.

In block 506, VWL 111 is compared to VREF_VWL 108 by VWL comparator 105. VREF_VWL 108 is received by VWL comparator 105 from VWL reference generator 102. The comparison of block 506 may be determined based on the control bits that were configured in block 501 of method 500. The comparison of block 506 may be performed as described above with respect to VWL comparator circuit 300 of FIG. 3. If it is determined in block 506 that VWL 111 is above VREF_VWL 108, flow returns to block 503 from block 506, and the VWL pumps 107A-D continue to generate VWL 111 as described with respect to blocks 503-505. If it is determined in block 506 that VWL 111 is not above VREF_VWL 108, flow proceeds from block 506 to block 507. In block 507, the VWL clock generators 106A-B are disabled based on VWL_CMP 109, and the VWL pumps 107A-B do not receive any pump signal. Flow then proceeds back to block 506 from block 507. When it is again determined in block 506 that VWL 111 is above VREF_VWL 108, the VWL clock generators 106A-B are re-enabled in block 503. Blocks 503-507 of method 500 may be repeated throughout operation of the memory module that includes the negative voltage generation system 100.

The process flow diagram of FIG. 5 is not intended to indicate that the operations of the method 500 are to be executed in any particular order, or that all of the operations of the method 500 are to be included in every case. Additionally, the method 500 can include any suitable number of additional operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
enabling a first negative word line voltage (VWL) clock generator;
providing by the first VWL clock generator, based on a clock signal, a first pump clock signal to a first VWL pump, and a second pump clock signal to a second VWL pump, wherein the first pump clock signal is out of phase with the second pump clock signal;
generating a VWL based on the first VWL pump and the second VWL pump, wherein the VWL is provided to a word line driver of a computer memory module;
comparing the VWL to a VWL reference voltage; and
based on the VWL being below the VWL reference voltage, disabling the first VWL clock generator, wherein the first VWL pump and the second VWL pump are disabled based on disabling the first VWL clock generator.

2. The method of claim 1, the method comprising:
enabling a second VWL clock generator;
providing by the second VWL clock generator, based on the clock signal, a third pump clock signal to a third VWL pump, and a fourth pump clock signal to a fourth VWL pump, wherein the third pump clock signal is out of phase with the fourth pump clock signal;
generating the VWL based on the first VWL pump, the second VWL pump, the third VWL pump, and the fourth VWL pump;
comparing VWL to the VWL reference voltage; and
based on the VWL being below the VWL reference voltage, disabling the second VWL clock generator, wherein the third VWL pump and the fourth VWL pump are disabled based on disabling the second VWL clock generator.

3. The method of claim 1, wherein the first VWL pump is connected to a supply voltage VDD and to a voltage bit line high (VBLH), wherein VBLH is from about 0.7 volts (V) to about 0.9 V.

4. The method of claim 1, wherein the first VWL pump comprises a wire capacitor that is connected in parallel with a low threshold voltage (LVT) n-type metal oxide semiconductor (NMOS) device, wherein a capacitance of the wire capacitor and LVT NMOS device is charged based on the first pump clock signal.

5. The method of claim 1, wherein comparing the VWL to the VWL reference voltage is performed by a VWL comparator, the VWL comparator comprising:
 input circuitry configured to receive the VWL reference voltage;
 a resistor ladder configured to receive the VWL;
 a comparator configured to compare the VWL to the VWL reference voltage; and
 a stack inverter configured to output an enable signal to the first VWL clock generator based on the comparison.

6. The method of claim 5, the method further comprising:
 receiving a plurality of control bits, each of the plurality of control bits comprising a direct current (DC) signal, by the VWL comparator, such that the plurality of control bits configure the VWL comparator based on projected process, voltage, and temperature (PVT) conditions in the computer memory module during operation of the computer memory module by bypassing one or more resistors in the input circuitry or the resistor ladder;
 wherein the input circuitry is configured to raise the VWL reference voltage; and
 wherein the resistor ladder is configured to lower the VWL.

7. The method of claim 1, wherein the computer memory module comprises an embedded dynamic access memory (eDRAM) memory module that is embedded in a processor chip.

8. A system comprising a circuit configured to:
 enable a first negative word line voltage (VWL) clock generator;
 provide, by the first VWL clock generator, based on a clock signal, a first pump clock signal to a first VWL pump, and a second pump clock signal to a second VWL pump, wherein the first pump clock signal is out of phase with the second pump clock signal;
 generate a VWL based on the first VWL pump and the second VWL pump, wherein the VWL is provided to a word line driver of a computer memory module;
 compare the VWL to a VWL reference voltage; and
 based on the VWL being below the VWL reference voltage, disable the first VWL clock generator, wherein the first VWL pump and the second VWL pump are disabled based on disabling the first VWL clock generator.

9. The system of claim 8, the circuit configured to:
 enable a second VWL clock generator;
 provide, by the second VWL clock generator, based on the clock signal, a third pump clock signal to a third VWL pump, and a fourth pump clock signal to a fourth VWL pump, by the second VWL clock generator, wherein the third pump clock signal is out of phase with the fourth pump clock signal;
 generate the VWL based on the first VWL pump, the second VWL pump, the third VWL pump, and the fourth VWL pump;
 compare the VWL to the VWL reference voltage; and
 based on the VWL being below the VWL reference voltage, disable the second VWL clock generator, wherein the third VWL pump and the fourth VWL pump are disabled based on disabling the second VWL clock generator.

10. The system of claim 8, wherein the first VWL pump is connected to a supply voltage VDD and to a voltage bit line high (VBLH), wherein VBLH is from about 0.7 volts (V) to about 0.9 V.

11. The system of claim 8, wherein the first VWL pump comprises a wire capacitor that is connected in parallel with a low threshold voltage (LVT) n-type metal oxide semiconductor (NMOS) device, wherein a capacitance of the wire capacitor and LVT NMOS device is charged based on the first pump clock signal.

12. The system of claim 8, wherein comparing VWL to the VWL reference voltage is performed by a VWL comparator, the VWL comparator comprising:
 input circuitry configured to receive the VWL reference voltage;
 a resistor ladder configured to receive the VWL
 a comparator configured to compare the VWL to the VWL reference voltage; and
 a stack inverter configured to output an enable signal to the first VWL clock generator based on the comparison.

13. The system of claim 12, the circuit configured to:
 receive a plurality of control bits, each of the plurality of control bits comprising a direct current (DC) signal, by the VWL comparator, such that the plurality of control bits configure the VWL comparator based on projected process, voltage, and temperature (PVT) conditions in the computer memory module during operation of the computer memory module by bypassing one or more resistors in the input circuitry or the resistor ladder;
 wherein the input circuitry is configured to raise the VWL reference voltage; and
 wherein the resistor ladder is configured to lower the VWL.

14. The system of claim 8, wherein the computer memory module comprises an embedded dynamic access memory (eDRAM) memory module that is embedded in a processor chip.

15. A device, comprising logic configured to:
 enable a first negative word line voltage (VWL) clock generator;
 provide, by the first VWL clock generator, based on a clock signal, a first pump clock signal to a first VWL pump, and a second pump clock signal to a second VWL pump, wherein the first pump clock signal is out of phase with the second pump clock signal;
 generate a VWL based on the first VWL pump and the second VWL pump, wherein the VWL is provided to a word line driver of a computer memory module;
 compare the VWL to a VWL reference voltage; and
 based on the VWL being below the VWL reference voltage, disable the first VWL clock generator, wherein the first VWL pump and the second VWL pump are disabled based on disabling the first VWL clock generator.

16. The device of claim 15, the logic configured to:
 enable a second VWL clock generator;
 provide, by the second VWL clock generator, based on the clock signal, a third pump clock signal to a third VWL pump, and a fourth pump clock signal to a fourth VWL pump, wherein the third pump clock signal is out of phase with the fourth pump clock signal;
 generate the VWL based on the first VWL pump, the second VWL pump, the third VWL pump, and the fourth VWL pump;
 compare the VWL to the VWL reference voltage; and
 based on the VWL being below the VWL reference voltage, disable the second VWL clock generator, wherein the third VWL pump and the fourth VWL pump are disabled based on disabling the second VWL clock generator.

17. The device of claim 15, wherein the first VWL pump is connected to a supply voltage VDD and to a voltage bit line high (VBLH), wherein VBLH is from about 0.7 volts (V) to about 0.9 V.

18. The device of claim 15, wherein the first VWL pump comprises a wire capacitor that is connected in parallel with a low threshold voltage (LVT) n-type metal oxide semiconductor (NMOS) device, wherein a capacitance of the wire capacitor and LVT NMOS device is charged based on the first pump clock signal.

19. The device of claim 15, wherein comparing the VWL to the VWL reference voltage is performed by a VWL comparator, the VWL comparator comprising:
    input circuitry configured to receive the VWL reference voltage;
    a resistor ladder configured to receive the VWL
    a comparator configured to compare the VWL to the VWL reference voltage; and
    a stack inverter configured to output an enable signal to the first VWL clock generator based on the comparison.

20. The device of claim 19, the logic configured to:
receive a plurality of control bits, each of the plurality of control bits comprising a direct current (DC) signal, by the VWL comparator, such that the plurality of control bits configure the VWL comparator based on projected process, voltage, and temperature (PVT) conditions in the computer memory module during operation of the computer memory module by bypassing one or more resistors in the input circuitry or the resistor ladder;
wherein the input circuitry is configured to raise the VWL reference voltage; and
wherein the resistor ladder is configured to lower the VWL.

\* \* \* \* \*